US007149137B2

(12) United States Patent
Rodriguez et al.

(10) Patent No.: US 7,149,137 B2
(45) Date of Patent: Dec. 12, 2006

(54) PROCESS MONITORING FOR FERROELECTRIC MEMORY DEVICES WITH IN-LINE RETENTION TEST

(75) Inventors: John Anthony Rodriguez, Richardson, TX (US); Richard Allen Bailey, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 136 days.

(21) Appl. No.: 11/027,221

(22) Filed: Dec. 30, 2004

(65) Prior Publication Data

US 2006/0146588 A1 Jul. 6, 2006

(51) Int. Cl.
G11C 7/00 (2006.01)
(52) U.S. Cl. .............. 365/201; 365/117; 365/145; 365/194
(58) Field of Classification Search ................ 365/145, 365/149, 194, 201, 117
See application file for complete search history.

(56) References Cited

U.S. PATENT DOCUMENTS

| 5,337,279 A * | 8/1994 | Gregory et al. ............. 365/201 |
| 5,525,528 A * | 6/1996 | Perino et al. ................... 438/3 |
| 5,661,730 A | 8/1997 | Mitra et al. |
| 5,969,935 A | 10/1999 | Kammerdiner et al. |
| 6,008,659 A | 12/1999 | Traynor |
| 6,238,933 B1 | 5/2001 | Sun et al. |
| 6,330,180 B1 * | 12/2001 | Noro et al. .................. 365/145 |
| 6,541,375 B1 | 4/2003 | Hayashi et al. |

OTHER PUBLICATIONS

Tanabe et al. "Individual Cell Measuring Method for FeRAM Retension Testing." 2001. 39th Annual International Reliability Physics Symposium. (pp. 23-27).*
Koike et al. "FeRAM Retention Analysis Method Based on Memory Cell Read Signal Voltage Measurement." Mar. 2001. International Conference on Microelectronics Test Structures, vol. 14. (pp. 37-41).*
"Reliability Properties of Low-Voltage Ferroelectric Capacitors and Memory Arrays", John A. Rodriguez, Keith Remack, Katsuchi Roku, K.R. Udayakumar, Sanjeev Aggarwal, Soctt R. Summerfelt, Francis G. Celii, Soctt Martin, Lindsey Hall, Kelly Taylor, Ted Moise Hugh Mcadams, Joe McPherson, Richard Bailey Glen Gox and Martin Depner, IEEE Transactions on Device and Materials Reliability, vol. 4, No. 3, Sep. 2004, pp. 436-449.

(Continued)

*Primary Examiner*—Richard Elms
*Assistant Examiner*—Alexander Sofocleous
(74) *Attorney, Agent, or Firm*—Jacqueline J. Garner; W. James Brady, III; Frederick J. Telecky, Jr.

(57) ABSTRACT

The present invention facilitates evaluation of ferroelectric memory devices. A ferroelectric memory device is fabricated that comprises memory cells comprising ferroelectric capacitors (802). A short delay polarization value is obtained (804) by writing a data value, performing a short delay, and reading the data value. A long delay polarization value is obtained (806) by again writing the data value, performing a long delay, and again reading the data value. The short delay and long delay polarization values are compared (808) to obtain a data retention lifetime for the ferroelectric memory device. The obtained data retention lifetime is compared with acceptable values (810) and, if deemed unacceptable, avoids unnecessary performance of thermal bake data retention lifetime testing.

23 Claims, 13 Drawing Sheets

OTHER PUBLICATIONS

"Effect of Operating conditions on the Fast-Decay Component of the Retained Polarization in Lead Zirconate Tilanate Thin Films", Joseph M. Benedetto, Randall A. Moore and F. Barry McLean, J. Appl. Phys. 75(1), Jan. 1, 1994, pp. 460-466.

"Influence of the Crystallization Thermal Treatment on the Structural and Electrical Properties of PZT Thin Films", Antonio Leondino Bacichetti Junior, Manuel Henrique Lente, Ricardfo Goncalves Mendes, Pedro Iris Paulin Filho, and Jose Antonio Eiras, Materials Research, vol. 7, No. 2, 2004, pp. 363-367.

"Polarization as a Driving Force in Accelerated Retention Measurements on Ferroelectric Thin Films", S. D. Traynor, IEEE, 1998, pp. 15-18.

"Fatigue and Retention Reliability of Low Voltage PZT Ferroelectric Films", J. Rodriguez, S. Aggarwal, S. Martin, S. Summerfelt, K.R. Udayakumar, T. Moise, R. Bailey, F. Chu, S. Sun, G. Fox and T. Davenport, Abstract/Conference presentation, Mar., 2003, 2 pgs.

* cited by examiner

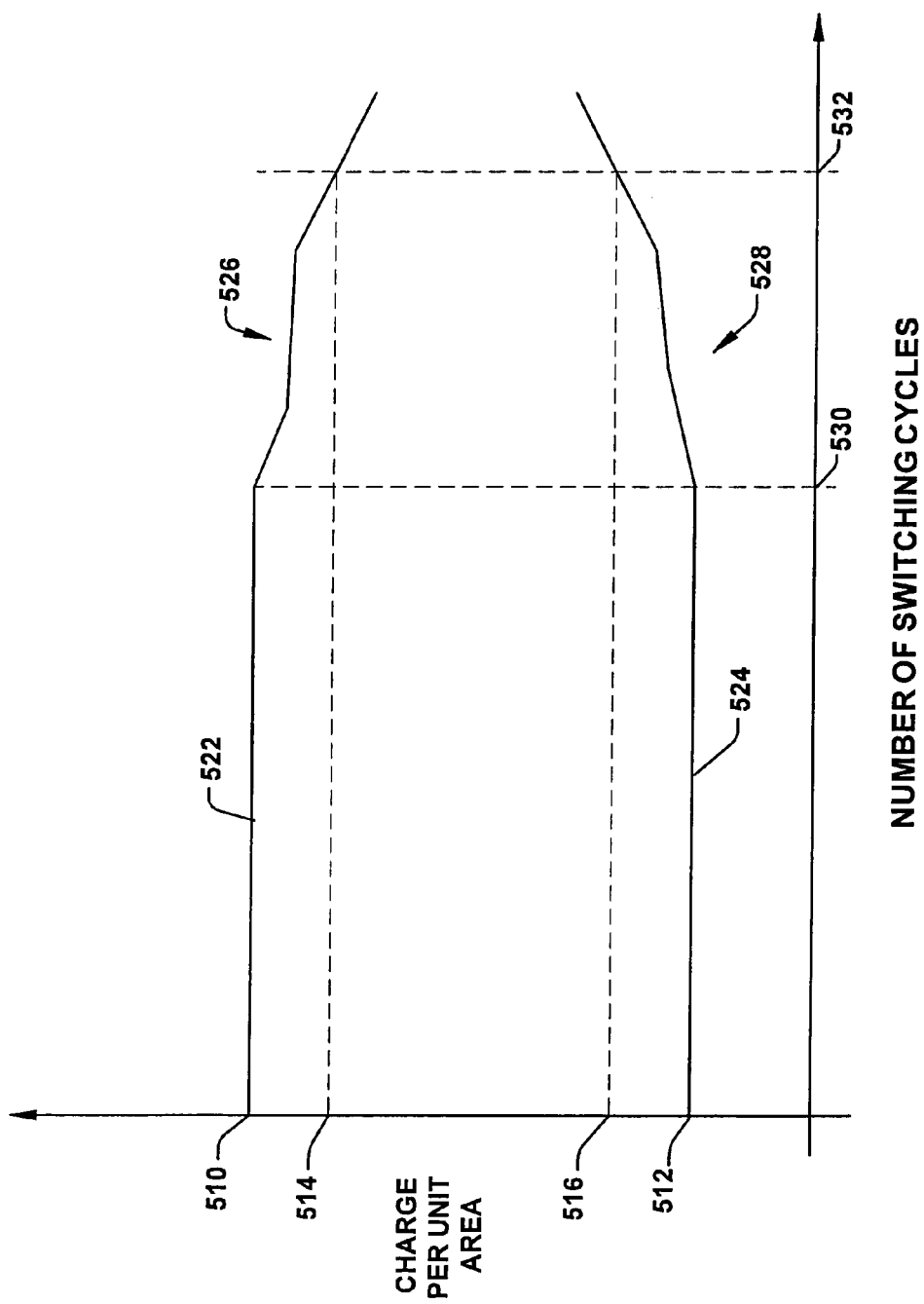

PROCESS MONITORING FOR FERROELECTRIC MEMORY DEVICES WITH IN-LINE RETENTION TEST

FIELD OF THE INVENTION

The present invention relates generally to memory devices, and more particularly, to systems and methods that evaluate operation and retention reliability of ferroelectric memory devices.

BACKGROUND OF THE INVENTION

Several trends exist today in the semiconductor device fabrication industry and the electronics industry. Devices are continuously getting smaller and requiring less power. A reason for this is that more personal devices are being fabricated that are relatively small and portable, thereby relying on a small battery as its supply source. For example, cellular phones, personal computing devices, and personal sound systems, personal digital assistants, and the like are devices that are in great demand in the consumer market. In addition to being smaller and more portable, personal devices are requiring more computational power and on-chip memory. In light of these trends and others, there is a need in the industry to provide devices that have a relatively large amount of memory. Additionally, it is also desirable that the memory maintains its information with or without power. Memory that retains its contents while a signal is not continuously applied to it is called a non-volatile memory. Examples of conventional non-volatile memory include: electrically erasable, programmable read only memory ("EEPROM") and FLASH EEPROM.

A ferroelectric memory (FRAM) is a non-volatile memory that utilizes a ferroelectric material as the capacitor dielectric situated between a bottom electrode and a top electrode. Both read and write operations are performed for a FRAM. The memory size and memory architecture affect the read and write access times of a FRAM. Table 1 illustrates exemplary differences between different memory types.

TABLE 1

| Property | SRAM | Flash | DRAM | FRAM (Demo) |
|---|---|---|---|---|
| Voltage | >0.5 V | Read >0.5 V Write (12 V) (±6 V) | >1 V | >1 V |
| Special Transistors | NO | YES (High Voltage) | YES (Low Leakage) | NO |
| Write Time | <10 ns | 100 ms | <30 ns | <50 ns |
| Write Endurance | NA | <$10^5$ | NA | >$10^{13}$ |
| Read Time (single/multi bit) | <10 ns | <30 ns | <30 ns/<2 ns | <50 ns |
| Read Endurance | NA | >$10^{15}$ | NA | >$10^{13}$ |
| Added Mask for embedded | 0 | ~6–8 | ~6–8 | ~2 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I current | Q charge | Q charge | P polarization |

The non-volatility of an FRAM is due to the bi-stable characteristic of the ferroelectric memory cell. Two types of memory cells are typically used, a single capacitor memory cell and a dual capacitor memory cell. The single capacitor memory cell (referred to as a 1T/1C memory cell) requires less silicon area (thereby increasing the potential density of the memory array), but is less immune to noise and process variations. Additionally, a 1T/1C cell requires a voltage reference for determining a stored memory state. The dual capacitor memory cell (referred to as a 2T/2C memory cell) requires more silicon area, and it stores complementary signals allowing differential sampling of the stored information. The 2T/2C memory cell has relatively more signal margin than a 1T/1C memory cell.

As illustrated in prior art FIG. 1, a 1T/1C FRAM cell 10 includes one transistor 12 and one ferroelectric storage capacitor 14. A bottom electrode of the storage capacitor 14 is connected to a drain terminal 15 of the transistor 12. The 1T/1C cell 10 is read by applying a signal to the gate 16 of the transistor (word line WL) (e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bit line 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. The sense amplifier reference voltage is generated by a ferroelectric or non-ferroelectric capacitor connected to complement bit line that is being read. In this manner, the memory cell data is retrieved.

A characteristic of the shown ferroelectric memory cell is that a read operation is destructive. The data in a memory cell is then rewritten back to the memory cell after the read operation is completed. This is analogues to the operation of a DRAM. One difference from a DRAM is that a ferroelectric memory cell will retain its state until it is interrogated, thereby eliminating the need of refresh.

As illustrated, for example, in prior art FIG. 2, a 2T/2C memory cell 30 in a memory array couples to a bit line 32 and an inverse of the bit line ("bit line-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bit line 32 and a first capacitor 40, and the second transistor 38 couples between the bit line-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bit line 32 and the bit line-bar 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bit line-bar 34, respectively. A differential signal (not shown) is thus generated across the bit line 32 and the bit line-bar 34 by the dual capacitor memory cell 30. The differential signal is sensed by a sense amplifier (not shown) that provides a signal corresponding to the logic level stored in memory.

As stated above, a ferroelectric capacitor includes a ferroelectric layer as a dielectric material sandwiched between a bottom electrode and a top electrode. The various read/write operations described supra utilize the ferroelectric properties, polarization, of the ferroelectric layer. However, over time, the ferroelectric properties of the ferroelectric capacitor can alter.

Data retention is the ability of a memory cell, particularly a non-volatile memory cell, to properly maintain stored data. Proper operation, including data retention, of ferroelectric memory devices depends on the bi-stable characteristic of the ferroelectric memory cell described above. However, over time, the bi-stable characteristic can degrade significantly and negatively affect data retention. Thus, ferroelectric memory devices can, over time, become unusable for some applications. Testing and characterization of ferroelectric device is needed to identify devices that meet or fail to meet required operational and lifetime characteristics. However, conventional testing mechanisms can be costly, time consuming, and destructive to the ferroelectric cells being tested.

Conventional testing mechanisms employ relatively high temperature and extended time bake cycles in order to simulate device life. The baking of memory arrays and/or devices as part of a test flow can potentially reduce the lifetime of the part, therefore, screening methods that include a thermal bake can also compromise the reliability of the memory device, even if the wares are not totally destroyed. Furthermore, conventional testing mechanisms can destroy the wafer upon which the devices are formed, thereby mitigating use on large numbers of wafers and/or devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to the fabrication and modification of ferroelectric memory devices, which are either stand-alone devices or integrated onto a semiconductor chip that includes other device types. Additionally, the present invention relates to characterizing and evaluating fabricated ferroelectric memory devices.

The present invention facilitates evaluation of ferroelectric memory devices by providing a relatively fast and low cost mechanism of identifying data retention lifetimes. The mechanism obtains polarization values following a short delay, less than about 100 micro-seconds, and long delay, greater than about 100 milli-seconds, after a programming pulse. Generally, the short delay is short enough that substantial relaxation has not occurred whereas the long delay is long enough that substantial relaxation has occurred. The differences between the short delay and long delay polarization values are indicators of data retention lifetimes for subject ferroelectric memory devices. Thus, the short delay and long delay polarization values can be correlated to obtain data retention lifetimes.

In accordance with an aspect of the present invention, a ferroelectric memory device is fabricated that comprises memory cells comprising ferroelectric capacitors. A short delay polarization value is obtained by writing a data value, performing a short delay, and reading the data value. A long delay polarization value is obtained by again writing the data value, performing a long delay, and again reading the data value. The short delay and long delay polarization values are compared to obtain a data retention lifetime for the ferroelectric memory device. The obtained data retention lifetime is compared with acceptable values and, if deemed unacceptable, avoids unnecessary performance of thermal bake data retention lifetime testing.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5B is a graph illustrating polarization performance of a ferroelectric capacitor as a function of read/write cycles.

DETAILED DESCRIPTION OF THE INVENTION

Figure 1:
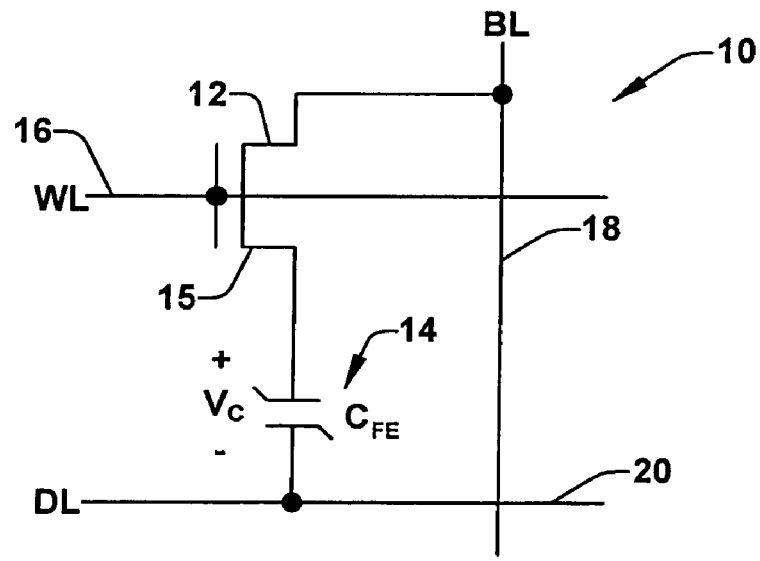
FIG. 1 is a schematic view of a conventional 1T/1C FRAM cell.

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention relates to the evaluation and characterization of ferroelectric memory devices after fabrication. The present invention can identify data retention limitations and other ferroelectric device fabrication problems without extensive testing. The present invention facilitates evaluation of ferroelectric memory devices by providing a relatively fast and low cost mechanism of identifying data retention lifetimes. The mechanism obtains short delay and long delay polarization values during sequences of programming operations. The differences between the short delay and long delay polarization values are indicators of data retention lifetimes for subject ferroelectric memory devices, as well as a general health indicator. Thus, the short delay and long delay polarization values can be correlated to obtain data retention lifetimes.

Ferroelectric memory (FRAM) devices are non-volatile, as discussed supra. However, the inventors of the present invention appreciate that over time and/or at elevated temperatures, ferroelectric memory devices tend to preferentially stabilize in a stored state, thereby reducing the lifetime of the opposite state. As a result, data retention capabilities for ferroelectric memory devices can degrade over time and/or at elevated temperatures. The length of time until devices are expected to have their data retention capabilities critically degraded is referred to as their data retention lifetime and can be considered to be an estimate of a device's actual lifetime.

A characteristic of ferroelectric memory devices and their ferroelectric capacitors is switched polarization, which refers to a difference in charge polarization between the two states of the ferroelectric capacitors. Memory circuits of the ferroelectric memory devices require a minimal amount of switched polarization in order to properly determine states of the ferroelectric capacitors and, therefore, determine stored data values. Lower switched polarization can cause a ferroelectric memory cell to fail and/or require costlier sensing circuitry in order to read the stored data values. Additionally, switched polarization for ferroelectric memory cells reduces over time and/or memory operations (e.g., reading and programming). As a result, a lower initial switched polarization reduces data retention lifetimes for affected ferroelectric memory cells.

The inventors of the present invention note that some mechanisms for modifying or improving data retention lifetimes include process development, material/dopant selection, and architecture selection. Processes employed in fabrication can be adjusted in order to reduce defects that lead to loss of signal margin and data retention. Material selection and dopant selection can be adjusted to compensate for defects in processing or fabrication to reduce a rate of imprint or reduce establishing a preferential state. Selection of architectures, such as 2T/2C, can be employed to also improve/modify data retention lifetimes.

Generally, a number of tests are performed after fabrication of ferroelectric memory devices. Initially, in-line parametric tests are performed on the fabricated devices that provide a number of parametric measurements of the device. Generally, ferroelectric memory devices include a number of test capacitors, which are employed to identify characteristics, such as, polarization charge per area. If the parametric measurements meet pre-selected and/or desired specifications, a relatively lengthy and costly test is performed to test data retention lifetimes of ferroelectric memory cells within the devices. This test is referred to as retention testing. If the measured retention meets desired specifications, the devices continue being processed and packaged. Otherwise, the device may be reworked or discarded.

The present invention incorporates a short/long delay retention test within the in-line parametric tests. The short/long delay retention test employs typical parametric tests employed in evaluating test capacitors to obtain an approximation or indication of data retention and does not require the time and cost employed in typical retention tests. Subsequently, if the parametric measurements and the indication of data retention meet desired specifications, the relatively lengthy and costly retention test is performed to test data retention lifetimes. If the measured retention meets desired specifications, the devices continue being processed and packaged. Otherwise, the device may be reworked or discarded. The present invention avoids unnecessarily performing retention testing by identifying problematic devices by the short/long retention test. Furthermore, the short/long retention test of the present invention does not require performing a bake (thermal step), which implies that a subject wafer does not require scrapping, as is typically done in conventional retention tests that require a bake. A typical, conventional bake based data retention lifetime test can cause the wafer to become un-usable for production thus incurring manufacturing loss. The present invention can obtain data retention lifetime information without a bake thereby allowing the retention testing to be obtained at any suitable point in the fabrication process (e.g., after metal 1) and is not necessarily scrapped. Also, by being able to test shortly after fabrication, potential issues can be identified quicker allowing the feedback loop to processing to be shorter and quicker. Additionally, the data retention lifetime testing of the present invention can be employed to test stand alone capacitors (PZT, electrodes, etch, with or without encapsulation on the sidewalls) or employed to test capacitors through the integration process (after metal 1 deposition or up to any metal layer supported by the fabrication process).

Figure 3:
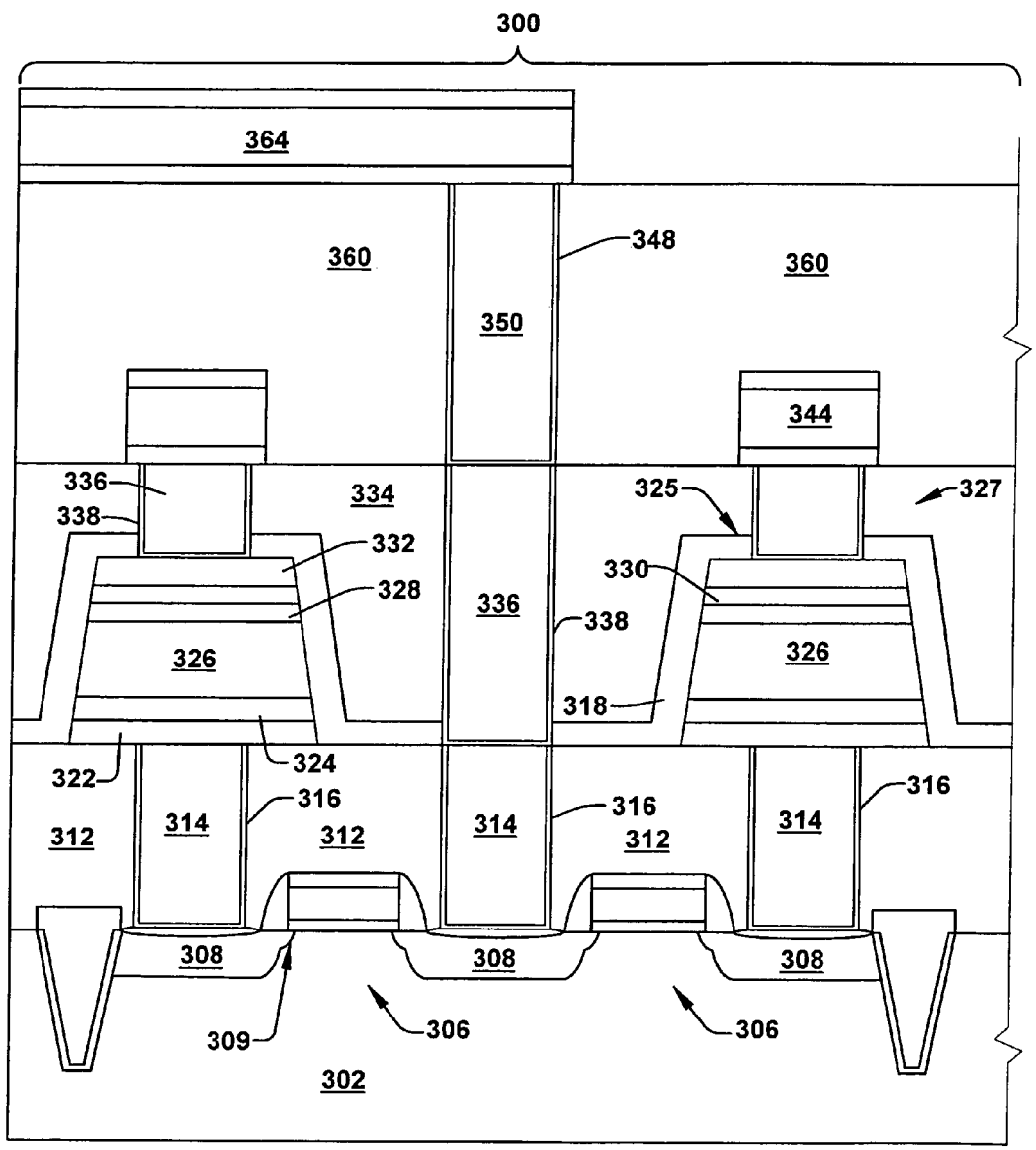
FIG. 3 is a cross sectional view of an exemplary ferroelectric semiconductor device.

Referring initially to FIG. 3, a cross section of an exemplary ferroelectric semiconductor device 300 is illustrated in accordance with an aspect of the present invention. The device 300 represents a partially fabricated version of a ferroelectric memory (FRAM) cell in accordance with the present invention. It is appreciated that the device 300 is but one example of many suitable ferroelectric memory devices in accordance with the present invention. Accordingly, it is also appreciated that suitable variations of the device 300 are contemplated in accordance with the present invention.

Gate structures 306 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 306 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 308 may be formed via, for example, implantation using conventional dopants and processing conditions. Lightly doped drain extensions 309 as well as pocket implants may also be utilized. In addition, the source/drain regions 308 may be silicided (for example, with titanium, cobalt, nickel, tungsten or other conventional silicide material).

A dielectric layer 312 is formed over the entire substrate 302 and is patterned and etched so as to form openings for contacts to the substrate and gate structures 306 to be formed. These openings are filled subsequently with one or more conductive materials, such as a plug 314 (for example, comprising a metal such as tungsten, molybdenum, titanium, titanium nitride, tantalum nitride, or a metal silicide such as Ti, Ni or Co, copper or doped polysilicon). A liner/barrier layer 316 may or may not be formed between the plug 314 and dielectric 312. Such a liner/barrier layer 316 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 312 comprises, for example, $SiO_2$ (doped or undoped with dopants such as boron or phosphorous) possibly with a layer of hydrogen or deuterium containing silicon nitride next to the gate. After deposition of the diffusion barrier 316 it is likely that the barrier will be planarized for improved lithography of overlying layers using a process such as chemical mechanical polishing (CMP). In addition, an added diffusion barrier/etch stop (not shown) may be included near the top surface of layer 312 such as $AlO_X$, AlN, $Si_3N_4$, $TiO_2$, $ZrO_2$, or $TaO_X$ that would be deposited after the planarization process. This diffusion barrier is particularly useful if damascene processes are used to create the via or metallization to the contact. The formation of the plug 314 will require etching through this optional barrier/etch stop.

Formation of metal structures which are situated above the contacts is considered to be part of the back end processes. Other than the specific FRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 312, 334 and 360). If formed, this thin dielectric comprises, for example, silicon nitride, silicon carbide, SiCNO or a silicon oxide (for example, a high-density plasma oxide). In addition, interlevel dielectric layers 312, 334, and 360 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof.

The interconnects and the metal lines preferably comprise the same material. Plugs 336 and 350 and conductors 344 and 364 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 338 and 348 and liners 342, 346, 362 and 366) comprises, for example, Ti, TiN, W, tungsten nitride, Ta, tantalum nitride, any conventional barrier/liner layer, or any combination or stack thereof). The interlayer dielectric and plug material should be compatible with the FRAM thermal budget. With existing technology (i.e., one that incorporates a W plug and $SiO_2$ ILD), the FRAM thermal budget should be less than approximately 600 or 650 C, however, the present invention is not limited thereto. If the ILD is modified to include a low dielectric constant ("low K") layer, the FRAM thermal budget may need to be reduced further. The preferred interlayer dielectric 312 is therefore a material that can withstand a thermal budget in excess of 600 C, such as silicon oxide (doped and/or undoped), silicon nitride, and/or silicon oxy-nitride.

Level 327 is added so as to accommodate the FRAM cells (FRAM process module). This FRAM process module allows the creation of ferroelectric or high dielectric constant capacitors to be easily added with maximum thermal budget for the new process module yet not impact the thermal budget of backend process. In particular, this level allows FRAM devices with capacitor under bit line configuration compatible with a high-density memory. However, it is possible, if planarity is not a necessity, to form the FRAM devices while not forming layer 327.

An FRAM capacitor, as illustrated in FIG. 3 at reference numeral 325, resides above the interlayer dielectric 312, and comprises several layers. The FRAM capacitor 325 of FIG. 3 comprises an electrically conductive barrier layer 322 upon which a conductive bottom capacitor electrode 324 resides (the terms conductive and insulative are employed to indicate electrically conductive and electrically insulative, respectively, unless indicated otherwise). A capacitor dielectric layer 326, a ferroelectric material, is formed over the bottom electrode 324, and is covered by, for example, a conductive multi-layer top electrode 328, 330. A top portion of the FRAM capacitor 325 comprises a hard mask layer 332 which, may be employed to facilitate the capacitor stack etch. The capacitor stack is covered and/or encapsulated by a sidewall diffusion barrier layer 318.

An initial or preliminary estimate of data retention of the FRAM capacitor 325 is obtained by performing one or more short/long retention tests. Each of which comprises writing a first data value to the capacitor, waiting a short period of time and reading back the first data value, also referred to as the short delay value. Then, writing the first data value to the capacitor 325, waiting a long period of time and again reading the first data value, also referred to as the long delay value. The long delay value and the short delay value are then compared and/or analyzed to determine or estimate reliability and retention for the FRAM capacitor. Generally, less polarization difference between the short delay and long delay values indicates better reliability and/or data retention lifetime. The long delay and short delay values can be compared with historical and/or experimental data in order to further determine data retention lifetimes and/or reliability.

Figure 4:
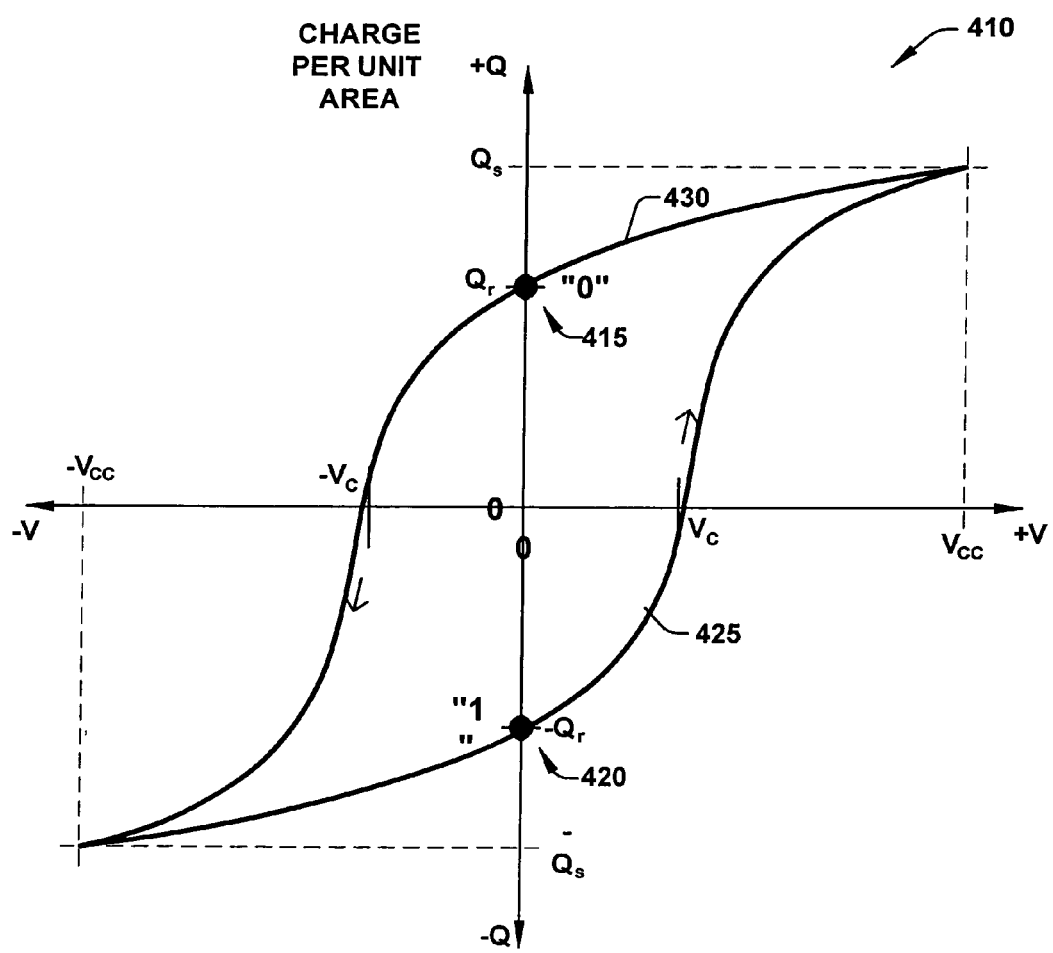
FIG. 4 is plot of an exemplary characteristic hysteresis loop for a ferroelectric capacitor.

A plot or graph 410 of an exemplary characteristic hysteresis loop for a ferroelectric capacitor in accordance with an aspect of the present invention is depicted in FIG. 4, and displays the total charge on the ferroelectric capacitor as a function of the applied voltage. Plot 410 illustrates the charge "Q" (in $uC/cm^2$) along a y-axis and the voltage "V" (in kV/cm) along an x-axis. Remnant charge ($Q_r$), saturation charge ($Q_s$), and coercive voltage ($V_c$) are three parameters that characterize the loop. When the voltage applied across the capacitor is 0V, the capacitor assumes one of the two stable states: "0" 415 or "1" 420. The total charge stored on the capacitor is $Q_r$ for a "0" 415 or $-Q_r$ for a "1" 420. A "0" can be switched to a "1" by applying a negative voltage pulse (−Vcc) across the ferroelectric capacitor. By doing so, the total charge on the ferroelectric capacitor is reduced by $2Q_r$, a change of charge that can be sensed by the sense amplifier (amp). Similarly, a "1" can be switched back to a "0" by applying a positive voltage pulse (+Vcc) across the capacitor, hence restoring the capacitor charge to $+Q_r$.

Characteristic curve segment 425 represents the charge path of a ferroelectric capacitor from a "1" state 420, thru $V_{cc}$ as charge is applied, and then thru curve segment 430 to the other stable "0" state 415 as the voltage is relaxed across the ferroelectric capacitor.

Data in a ferroelectric memory cell is read by connecting a reference voltage to a first bit line, connecting the cell capacitor between a complimentary bit line and a plate line signal voltage, and interrogating the cell. There are several suitable techniques to interrogate an FRAM cell. Two suitable interrogation techniques that can be employed are step sensing (up only) and pulse sensing (up and down). In both these interrogation techniques, the cell capacitor is coupled to the complimentary bit line by turning ON an access or a pass gate transistor. In the step sensing, the plate line voltage is stepped from ground (Vss) to a supply voltage (Vdd). In the pulse sensing the plate line voltage is pulsed from Vss to Vdd and then back to Vss. This provides a differential voltage on the bit line pair, which is connected to a sense amp circuit. The reference voltage (in a 1T1C configuration) is typically supplied at an intermediate voltage between a voltage ($V_{"0"}$) generated by a capacitor programmed to a binary "0" 415 of FIG. 4, and that of the capacitor programmed to a binary "1" ($V_{"1"}$) 420. The intermediate voltage is roughly ((bitline voltage "1")−(bitline voltage "0"))/2) (e.g., 80 to 100 milli-volts). The resulting differential voltage at the sense amp terminals represents the data stored in the cell, which is buffered and applied to a pair of local IO lines.

The transfer of data between the ferroelectric capacitors, the sense amp circuit, and the local data bit lines is controlled by various access transistors, typically MOS devices, with switching signals being provided by control circuitry in the device. In a typical ferroelectric memory read sequence, the two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary "0" or to a "1".

FIG. 4 and the accompanying description are provided for illustrative purposes and are not intended to be a complete description of the operation of a ferroelectric capacitor, but merely to highlight some aspects of its operation.

Figure 5A:
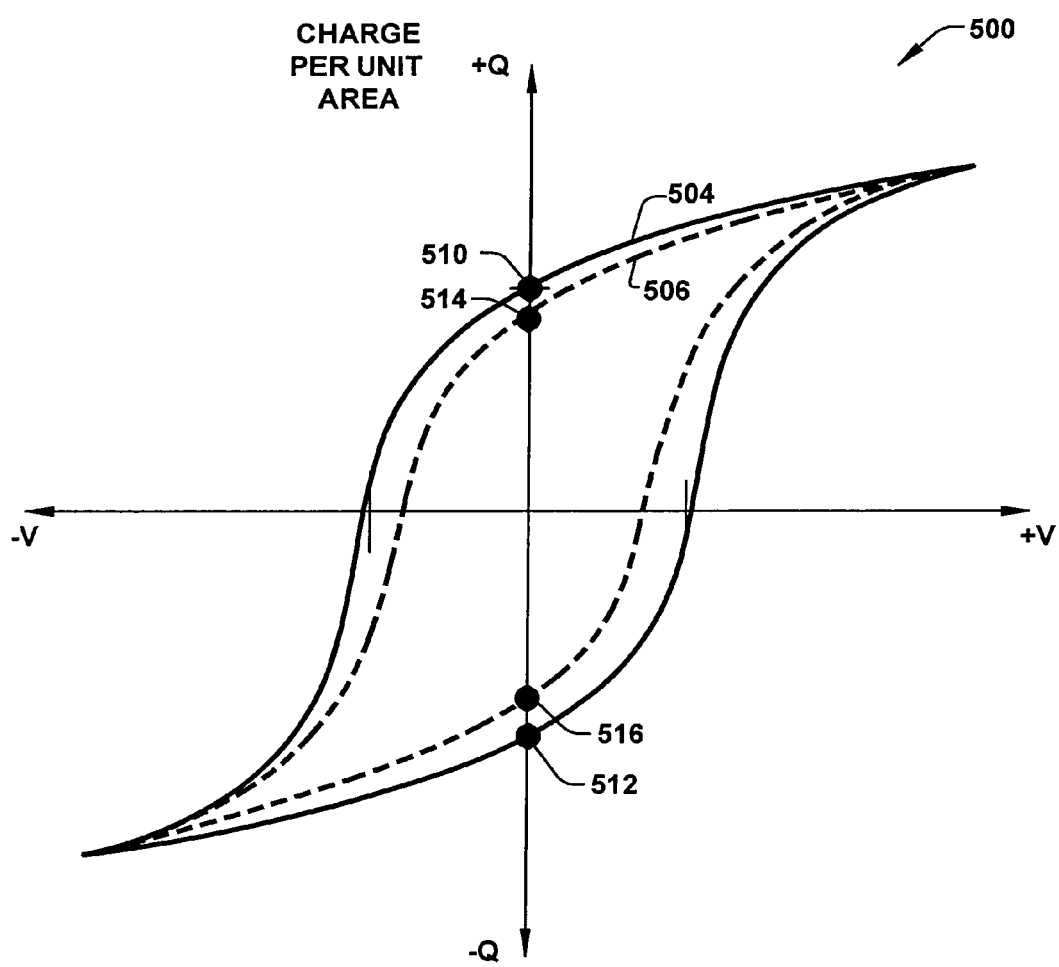
FIG. 5A is a graph illustrating polarization vs. applied electric field for an exemplary ferroelectric capacitor.

FIG. 5A illustrates a graph 500 showing polarization in $uC/cm2$ vs. applied electric field in kV/cm for an exemplary ferroelectric capacitor. A first curve 504 illustrates the polarization performance of an unstressed ferroelectric capacitor and a second curve 506 illustrates the ferroelectric capacitor after a number of read/write cycles and/or amount of time. FIG. 5B provides a graph 520 that illustrates the polarization performance (positive and negative directions) of the ferroelectric capacitor as a function of read/write cycles. The ferroelectric capacitor initially attains a positive residual polarization value 510 and a negative value 512 along the positive portion 526 and the negative portion 528 of curves 522 and 524, respectively.

Generally, after an integer number of cycles 530 an onset of fatigue is noticeable in both curves 522 and 524. Thereafter, along portions 526 and 528, the positive and negative polarization performance degrades. At a number of cycles 532, the positive polarization drops to a value 514 and the negative polarization drops to a value 516, which are below proper operational levels for the ferroelectric capacitor (e.g., when signal read margin falls below a predetermined level). It is noted that, generally, the greater the initial polarization values 510 and 512, the more switching cycles may be performed until the minimal values 514 and 516 are reached. As a result, the greater the initial polarization values, the longer the data retention lifetime for the ferroelectric capacitor and memory cell.

Figure 6A:
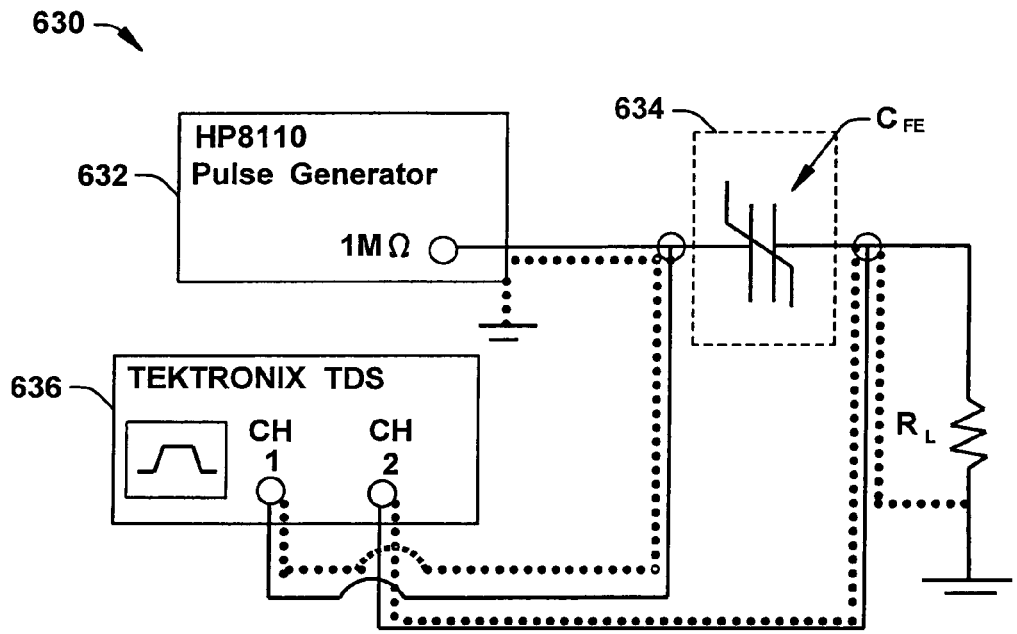
FIG. 6A is a block diagram illustrating a conventional ferroelectric memory fatigue test setup.
Figure 6B:
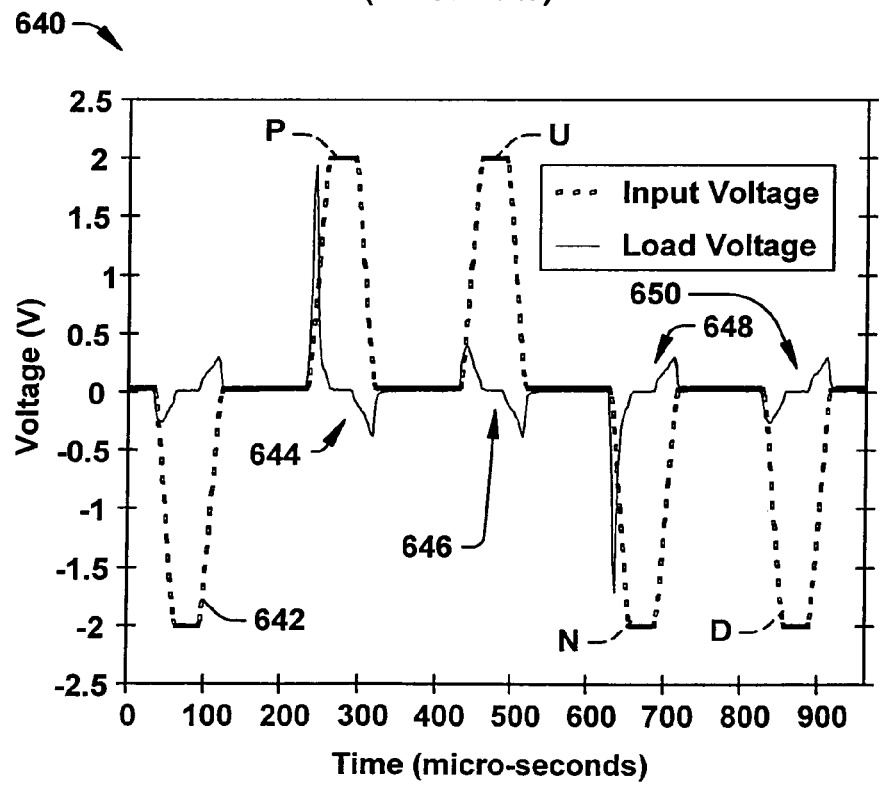
FIG. 6B is a graph illustrating a sequence of pulses employed to measure polarization of ferroelectric memory cells.

FIGS. 6A and 6B are provided to illustrate a mechanism of measuring polarization. FIG. 6A illustrates a conventional ferroelectric memory fatigue test setup 630. The test setup 630 has an external pulse generator 632 connected to a first electrode or terminal of a ferroelectric capacitor $C_{FE}$ on a wafer 634, as well as an external oscilloscope 636 having first and second channels to monitor voltages at both ferroelectric capacitor terminals. An external load resistor $R_L$ is connected from the second capacitor terminal to system ground, wherein the external pulse generator 632 provides a bipolar pulse (e.g., positive and negative) to the first capacitor terminal with respect to ground. However, the coupling of the external pulse generator 632 to the capacitor $C_{FE}$ in the wafer 634 for the setup 630 can limit the frequency at which the generator may be operated.

Once the desired number of stress pulses have been applied, the extent of fatigue on the capacitor $C_{FE}$ in the wafer 634 may be measured, for example using PUND test procedures, as illustrated in a graph 640 in FIG. 6B of applied pulse voltage versus time. The dashed line curve represents an applied pulse voltage waveform, such as applied by the pulse generator 632 during performance verification following fatigue cycling, and the solid curve represents the voltage across the load resistor $R_L$. Where the value of the resistor $R_L$ is known, the current there through may be ascertained. Following one or more initial pulses 642 (which set the ferroelectric capacitor to a known polarization state), two positive pulses P and U are applied by the generator 632, and the resulting current waveforms 644 and 646 are measured using the oscilloscope 636. The positive switched polarization may be determined according to the following equation (1):

$$Psw(+) = (\int (I_P - I_U) dt)/A, \quad (1)$$

where $I_P$ and $I_U$ are the current waveforms corresponding to the "positive" pulse "P" and the "up" pulse "U", respectively, and where A is the area of the ferroelectric capacitor $C_{FE}$ in cm². The resulting polarization value (e.g., switching charge density in uC/cm²) may then be plotted as one point on a positive polarization curve, such as the curve 522 depicted in FIG. 5B.

Thereafter, two negative polarity pulses N and D are applied to the capacitor $C_{FE}$ using the pulse generator 632. The resulting current waveforms 648 and 650 are measured using the oscilloscope 636, wherein the negative switched polarization may be determined according to the following equation (2):

$$Psw(-)=(\int (I_N-I_D)dt)/A, \qquad (2)$$

where $I_N$ and $I_D$ are the current waveforms corresponding to the "negative" pulse "N" and the "down" pulse "D", respectively. This value may then be plotted as one point on a negative polarization curve, such as the curve 524 of FIG. 5B. Further stress pulses may then be applied to the capacitor $C_{FE}$, after which another PUND test is performed to obtain further points on the curves. It is noted that other mechanisms of measuring polarization employ a load capacitor instead of the load resistor. Employing a load capacitor inhibits or makes difficult the measurement of short delay polarization values and, necessarily, prevents comparison of short delay polarization values with long delay polarization values.

Figure 7A:
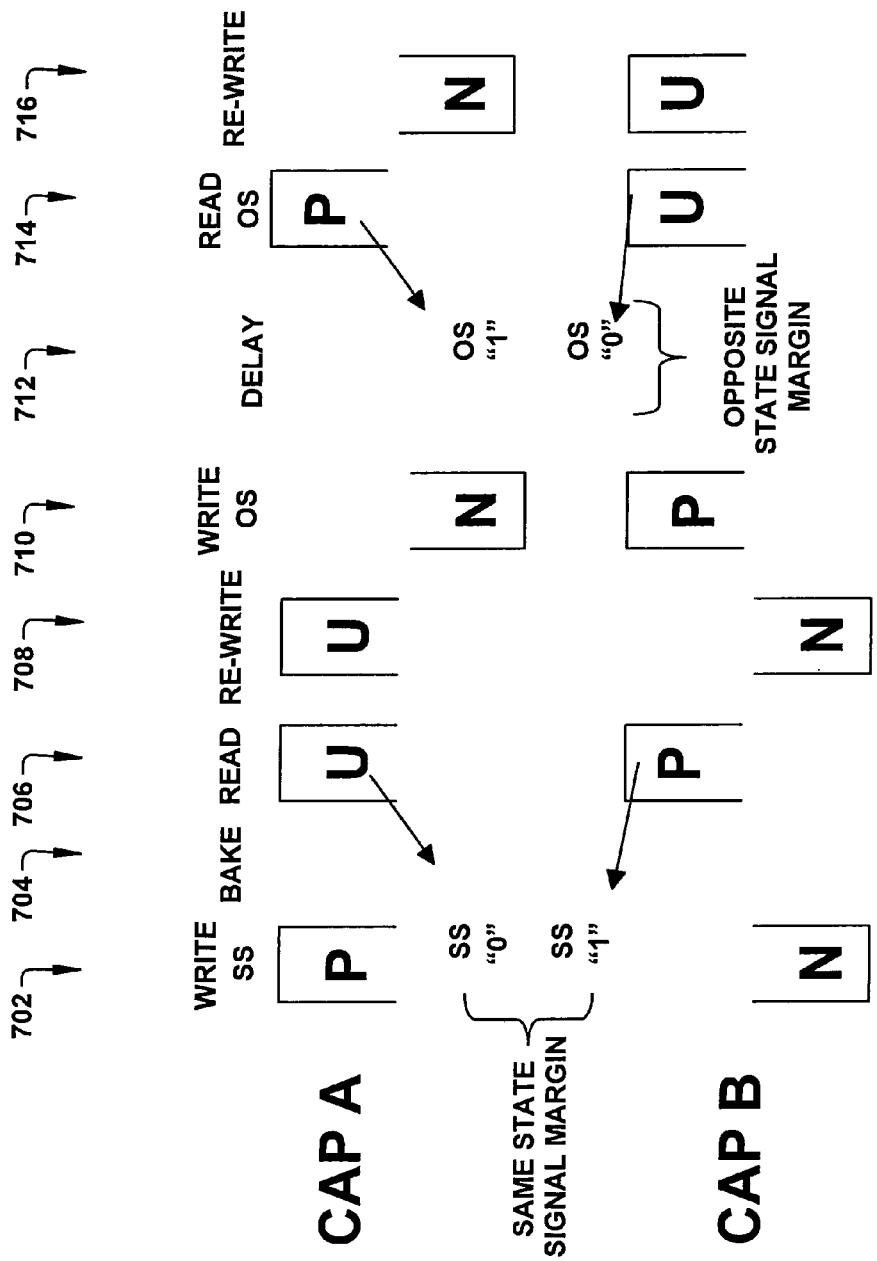
FIGS. 7A and 7B are diagrams illustrating an exemplary process of obtaining data retention lifetimes for ferroelectric memory cells that employs a bake.
Figure 7B:
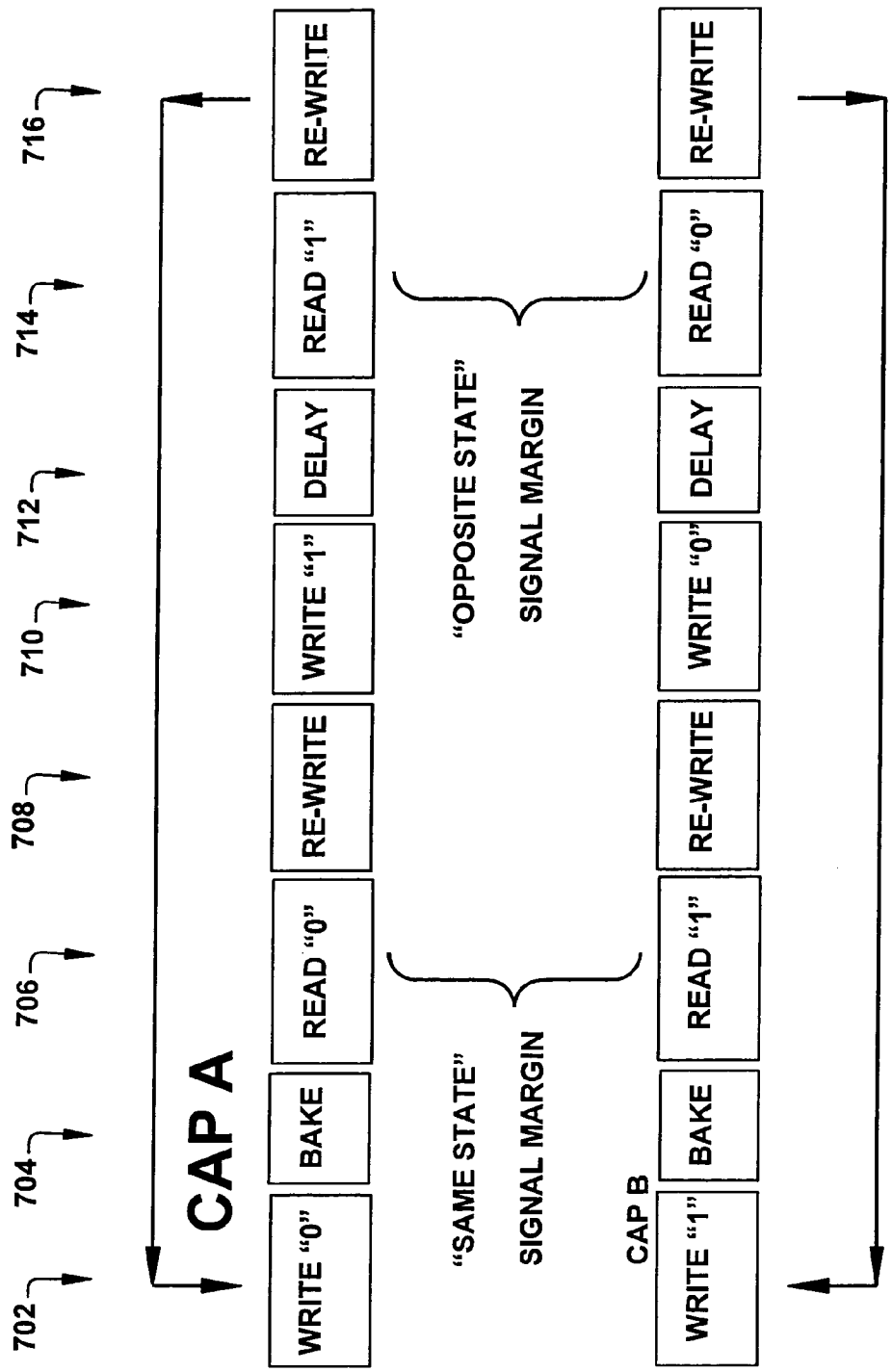

Turning now to FIGS. 7A and 7B, diagrams illustrating an exemplary process of obtaining switched polarization margin values and data retention lifetimes for ferroelectric memory cells is provided. The process employs first and second ferroelectric capacitors designated CAP A and CAP B, respectively, instead of a single ferroelectric capacitor. The first and second ferroelectric capacitors are typically test capacitors and the process provides an indication of the quality of the material employed with and the fabrication process of ferroelectric memory devices. FIG. 7A depicts a logical 0 as "0", a logical 1 as "1", same state as SS, opposite state as OS, a positive pulse as "P", a negative pulse as "N", and an Up pulse as "U".

As stated above, ferroelectric capacitors are written by applying a positive pulse to write a logical 0 and by applying a negative pulse to write a logical 1. As discussed previously, reading ferroelectric capacitors can be destructive. Read operations are performed by applying a positive pulse to the plate line of the capacitor and interrogating the capacitor by coupling the opposite capacitor plate to a bit line. The correct, stored value is obtained by the positive pulse and leaves the capacitor in a positive state even if it was previously in a negative state (e.g., storing a 1), which in such cases results in a destructive read operation.

An initialization sequence can be performed wherein a time zero read for each capacitor is taken prior to baking the capacitors after the initial write operation performed at 702. A delay of a time period (e.g., milliseconds or greater) is performed after the initial write and then the time zero read is obtained. The exemplary process 700 begins at 702 where a positive pulse "P", which corresponds to a logical 0, is written to CAP A and a negative pulse "N", which corresponds to a logical 1, is written to CAP B. As a result, CAP A is now in a positive state and CAP B is in a negative state. CAP A and CAP B are then baked at a selected temperature for a selected time (e.g., 150 degrees Celsius for 2–4 hours) at 704. A read operation is performed at 706 by applying a positive pulse "U" to CAP A and "P" to CAP B, which leaves the state of CAP A unchanged, and interrogating the capacitors as discussed above. CAP A reads a logical 0 and CAP B correctly reads a logical 1. CAP A remains un-switched and in a positive state but CAP B, because of the positive read pulse, is now in a positive state. These reads illustrate same state retention and generally applies even at relatively high temperatures. Since it is known what data was written to the cells, by comparing the expected data to actual data, same state data errors in the cells may be ascertained. Additionally, a same state signal margin, which is the polarization difference between the two reads from CAP A and CAP B, is also obtained. These polarization amounts can also be plotted in a graph similar to that of FIG. 5B.

To simulate normal memory operation, a re-write is performed on CAP A by applying another positive pulse "U" and on CAP B by applying a negative pulse "N" at 708 wherein the read values, logical 0 and logical 1, are written to CAP A and CAP B, respectively, to restore the CAP A and CAP B to the state that was just written. As discussed above, the destructive nature of the read operation requires that read data be re-written during normal cell operation.

Opposite states are then written to CAP A and CAP B such that each capacitor is written to a state opposite that with which it was previously written and baked at 710. In order to do so, a negative pulse "N" is applied to CAP A causing CAP A to be at a negative state and a positive pulse "P" is applied to CAP B causing CAP B to be at a positive state. A delay for a selected amount of time is performed at 712 to allow the capacitors to reach steady state. Continuing at 714, an opposite state read is performed by applying a positive pulse "P" to CAP A and a positive pulse "U" to CAP B. CAP A should read as a logical 1 and CAP B should read as a logical 0. Again, since the written data is known, the read data can be compared to the expected (written) data to determine whether any opposite state errors occurred. Similar to the same state signal margin, an opposite state signal margin, the polarization difference between the two reads, is obtained for CAP A and CAP B. These polarization amounts can also be plotted in a graph similar to that of FIG. 5B. The read data is re-written at 716. Then, another run or execution of the method 700 can be performed by writing the initial, same state values to CAP A and CAP B at 702 again.

The inventors of the present invention note that this mechanism of testing for data retention lifetimes requires substantial time and can incur significant cost. Furthermore, the mechanism employs several bake/test cycles in order to simulate extended lifetimes. As a result, the process can be destructive to ferroelectric memory devices and, therefore, limited in its application. In contrast, the methods described below in accordance with the present invention are substantially non-destructive and can, therefore be employed for large numbers of ferroelectric devices without significant risk of damage.

Figure 8:
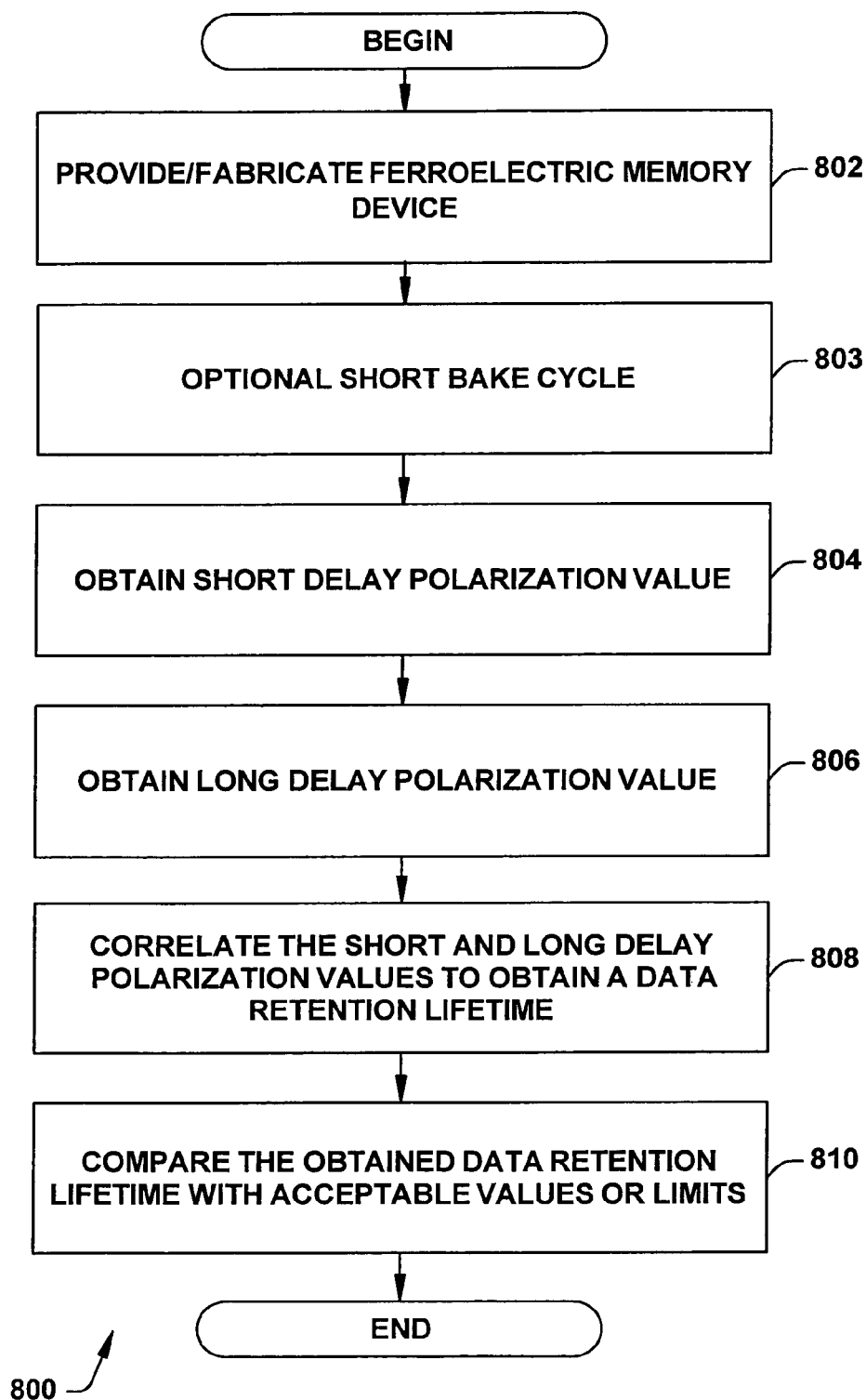
FIG. 8 is a flow diagram illustrating a method for performing an in-line retention test in accordance with an aspect of the present invention.

FIG. 8 is a flow diagram illustrating a method 800 for performing an in-line retention test in accordance with an aspect of the present invention. The method 800 generally obtains a short delay polarization margin and a long delay polarization margin for a ferroelectric memory device and correlates these values to a data retention lifetime. If the data retention lifetime is acceptable, further testing of the device, including conventional bake retention testing, can be performed. Generally, large differences between the short delay polarization margin and the long delay polarization margin indicate a relatively weak data retention lifetime (e.g., less than expected) whereas smaller differences indicate a relatively strong data retention lifetime (e.g., a suitable data retention lifetime). The method 800 can be performed in line during fabrication and/or after packaging because it is generally non-destructive.

Figure 2:
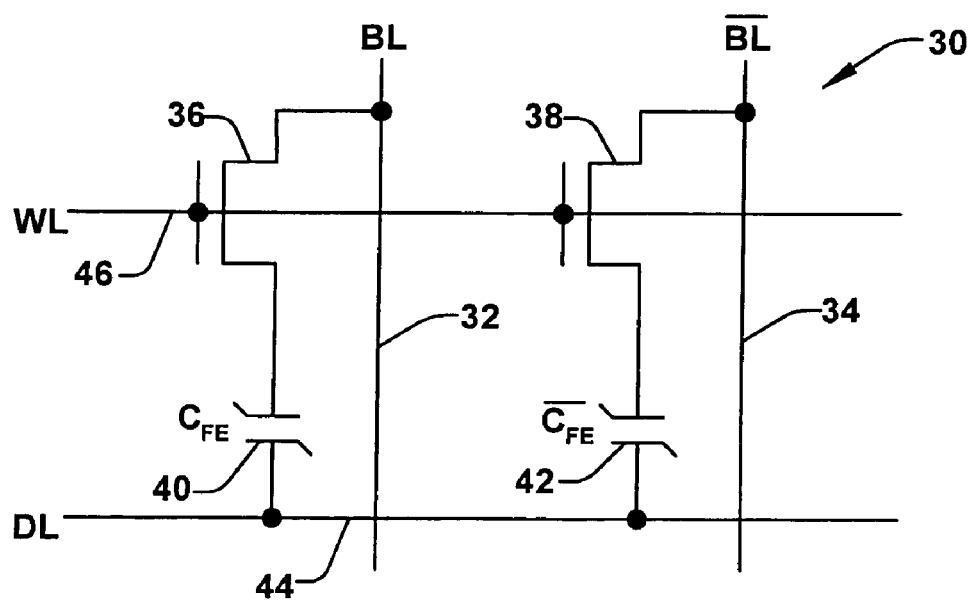
FIG. 2 is a schematic view of a conventional 2T/2C FRAM cell.

The method 800 begins at block 802 wherein a ferroelectric memory device is fabricated. The ferroelectric memory device is fabricated with ferroelectric memory cells that comprise ferroelectric capacitors, which comprise ferroelectric material that provides the expected device operation as shown in FIG. 4. The ferroelectric capacitors are comprised of suitable material, such as, but not limited to, Pb(Zr,Ti)O3 (PZT), (Ba,Sr)TiO3 (BST), SrTiO3 (STO) and SrBi2Ta2O9 (SBT), BaTiO3 (BTO), (BilxLax) 4Ti3O12 (BLT), or other ferroelectric material, fabricated between two conductive electrodes. Generally, one of the electrodes is connected to a drive line or plate line and the other is selectably connected to a bitline or bitline bar, such as shown in FIGS. 1 and 2.

A short bake cycle is performed at block 803, which facilitates activating impurities in ferroelectric capacitors of the device. The short bake cycle is performed for a duration of about an hour at a temperature ranging from about 85 degrees Celsius to about 200 degrees Celsius. Typically, the ferroelectric memory cells are written with a data value prior to raising the temperature. Nitrogen or Argon is typically employed during the bake to protect the memory device, particularly metallization layers. It is appreciated that alternate aspects of the invention include omitting the short bake cycle at block 803.

A short delay polarization value for one or more ferroelectric capacitors is obtained at block 804. Generally, the short delay polarization margin is obtained by writing data values to the capacitors and reading the written values back after a short delay (e.g., less than about 100 micro-seconds).

A long delay polarization value for the one or more ferroelectric capacitors is obtained at block 806. The long delay polarization margin is typically obtained by writing data values to the capacitors and reading the written values back after a relatively long delay (e.g., 100 or more milli-seconds). However, it is appreciated that different compositions and thicknesses of devices can require short delays and long delays varied from the above description. Generally, the short delay is short enough that substantial relaxation has not occurred whereas the long delay is long enough that substantial relaxation has occurred.

The short delay polarization value and the long delay polarization value are correlated at block 808 obtain a data retention lifetime of the memory device. The short delay polarization value and the long delay polarization value can also be compared with experimental data to more accurately identify the data retention lifetime. It is noted that the data retention lifetime obtained at block 808 is an estimate and may not be as accurate as conventional thermal bake-based data retention lifetime testing. As stated above, large differences between the short delay polarization margin and the long delay polarization margin generally indicate a relatively weak or low data retention lifetime (e.g., less than expected) whereas smaller differences generally indicate a relatively strong data retention lifetime (e.g., a suitable data retention lifetime).

Continuing at block 810, the obtained data retention lifetime is compared with a threshold value to determine whether the device is acceptable. If acceptable, further testing, such as thermal bake based retention lifetime testing, is performed. Otherwise, the thermal bake based retention lifetime testing can be avoided, which can save considerable time and cost.

It is appreciated that the one or more capacitors can be pre-conditioned by cycling prior to performing the method 800 in accordance with the present invention. An exemplary pre-conditioning could include a fixed set of parameters (e.g., 1 million cycles at a given frequency with a given voltage) that would be applied to all structures in the same manner. Additionally, the one or more capacitors can be post-conditioned by cycling after performing one or more runs of the method 800.

The one or more capacitors employed in the method 800 can be test capacitors fabricated at block 802. However, the present invention is not limited to being performed on test capacitors and can be performed on ferroelectric capacitors of almost any ferroelectric memory cells of the device. Thus, one or more ferroelectric memory cells can be selected that comprise the one or more memory cells. Further, the one or more capacitors can be from ferroelectric memory cells representing a subset of all the ferroelectric memory cells of the device. Additionally, the one or more capacitors can be from an array of memory cells or pairs from two separate arrays of ferroelectric memory cells. Alternately, the one or more capacitors can be portions of engineering test structures, which are simulated memory cells that comprise a ferroelectric capacitor, but do not necessarily have all the features of regular ferroelectric memory cells.

Figure 9A:
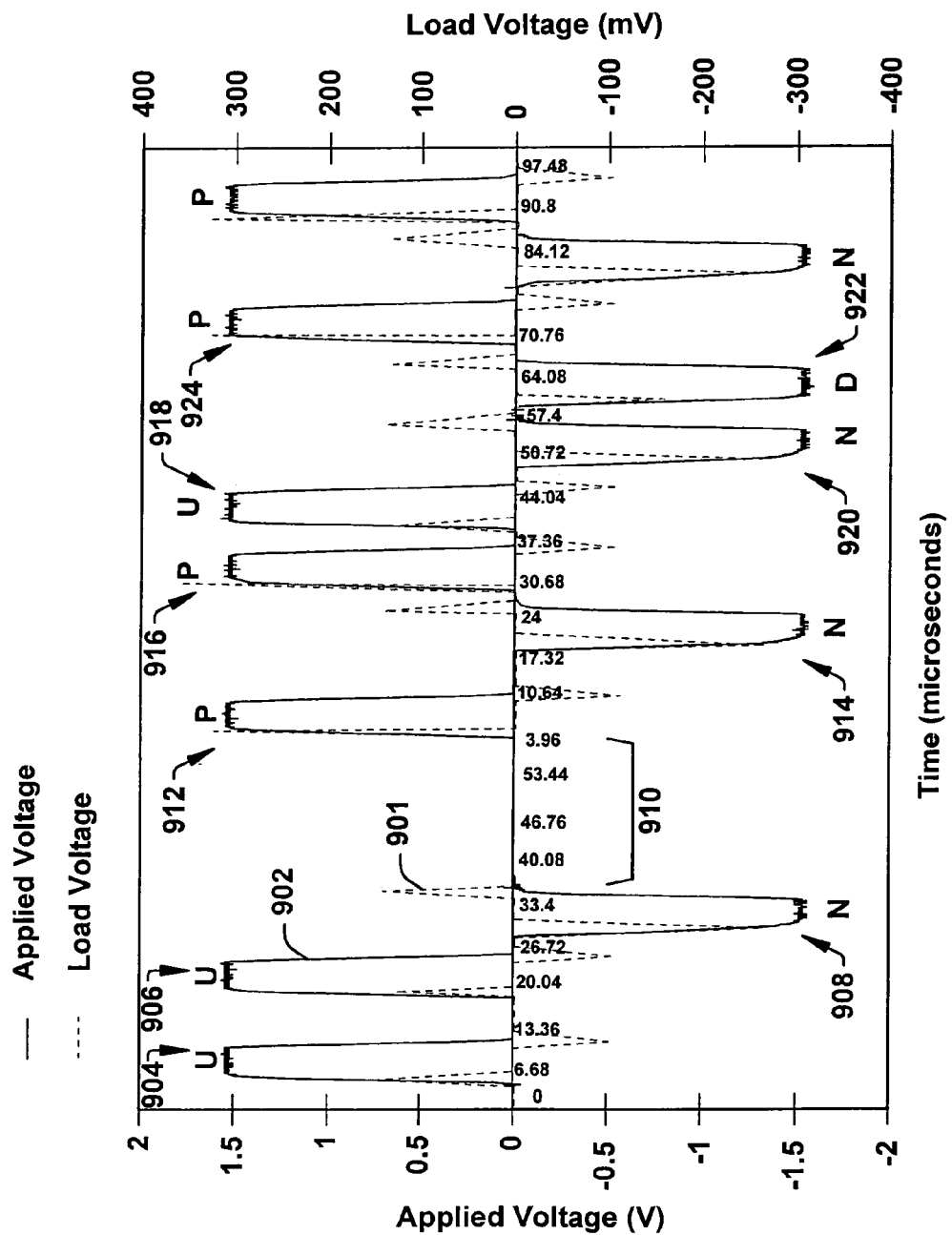
FIG. 9A is a graph illustrating an exemplary sequence of pulses that obtains long and short delay polarization values in accordance with an aspect of the present invention.

FIG. 9A is a graph 900 illustrating an exemplary run or sequence of applied pulses that obtains long and short delay polarization values in accordance with an aspect of the present invention. The exemplary run is typically performed on one capacitor (e.g., CAP A) whereas a similar, but complementary, run is performed on another capacitor (e.g., CAP B). The one capacitor is tested for short delay and long delay polarization values with respect to data "1" or negative values. The long and short delay polarization values can then be employed to obtain a data retention lifetime for a device containing the capacitor.

A solid curve 902 represents an applied pulse voltage waveform, such as applied by the pulse generator 632 of FIG. 6A, and the dashed curve 901 represents a load voltage, such as the load voltage across the load resistor $R_L$ of FIG. 6A. It is appreciated that other test mechanisms employing load resistors and/or load capacitors can be employed in accordance with the present invention. However, those employing load capacitors employ different pulse sequences.

In the graph 900, a first y-axis depicts applied voltage in volts, a second y-axis depicts load voltage in milli-volts, and an x-axis depicts time in microseconds. It is noted that this discussion relates data values or states of "0" with positive pulses and data values or states of "1" with negative pulses. However, the states of the ferroelectric capacitor can be assigned differently and still be in accordance with the present invention.

Initially, a positive pulse U is applied at 904, which can be employed to read a current value of the capacitor and also write a "0". The load voltage 901 at this point increases to a positive peak value, referred to as an on-pulse term, and decreases to a negative peak value, referred to as an after-pulse term. Positive switched polarization can be determined by integrating a current waveform resulting from the load voltage over the period of applying the U pulse. It is noted that this polarization value includes the on-pulse term and the after-pulse term. The inventors of the present invention note that other conventional test mechanisms ignore the after-pulse term, which can lead to inaccurate polarization values.

Continuing, another positive U pulse is applied at 906, which writes or re-writes a "0" to the capacitor. The load voltage 901 at this point increases to a positive peak value, referred to as an on-pulse term, and decreases to a negative peak value, referred to as an after-pulse term. Positive switched polarization can be determined by integrating a current waveform resulting from the load voltage over the period of applying the U pulse, such as described above. It is noted that the positive peak value here is less than the positive peak value of the previous U pulse, likely due to relaxation. Relaxation occurs during the delay between the previous write pulse and the first U pulse 904. The relaxation can be due to either long write/delay time, or the initial increased peak value may be due to thermal depolarization that can result from high temperature exposure.

A negative pulse N is then applied at 908, which writes a "1" to the capacitor. The load voltage 901 at this point decreases to a negative peak value, referred to as an on-pulse term, and increases to a positive peak value, referred to as an after-pulse term. Negative switched polarization can be determined by integrating a current waveform resulting from the load voltage over the period of applying the N pulse.

After a relatively long delay, as indicated by 910, a positive read pulse P is applied at 912 to read back the written "1". Here, the load voltage 901 increases to a positive peak value for an on-pulse term and decreases to a negative peak value for an after-pulse term. Positive switched polarization can be determined by integrating a current waveform resulting from the load voltage over the period of applying the P pulse. This polarization is referred to as the long delay polarization value.

Since the read at 912 is destructive, a "1" value is rewritten by a negative pulse N at 914. The load voltage 901 at this point decreases to a negative peak value for an on-pulse term and increases to a positive peak value for an after-pulse term. Negative switched polarization can be determined by integrating a current waveform resulting from the load voltage over the period of applying the N pulse.

Subsequently, a PUND sequence follows. A positive read pulse P is applied at 916 reads the rewritten "1" value. Here, the load voltage 901 increases to a positive peak value for an on-pulse term and decreases to a negative peak value for an after-pulse term. Positive switched polarization can be determined by integrating a current waveform resulting from the load voltage over the period of applying the P pulse. This polarization is referred to as the short delay polarization value. It can be seen that the peak value for the load voltage is greater than the peak value for the load voltage at the positive pulse P applied at 912, which indicates less relaxation has occurred. Generally, less difference in peak value in the load voltage at 912 and 916 indicates a more reliable, longer data retention lifetime ferroelectric memory device because less relaxation is present. Additionally, comparison of the short delay and long delay polarization values also indicates reliability or quality of the ferroelectric memory capacitor. Similar to the peak values in the load voltages, less difference in polarization values between the long delay and short delay values indicate a more reliable or higher quality ferroelectric memory capacitor and, therefore, a more reliable or higher quality ferroelectric memory device.

A positive pulse U is then applied at 918 and allows for signal margin to be obtained with the previous P pulse at 916. The pulse U can read a 0 written by the previous P pulse. Once again, the load voltage 901 increases to a positive peak value for an on-pulse term and decreases to a negative peak value for an after-pulse term. However, the positive peak value is substantially less than obtained with the previous P pulse at 916. The signal margin can then be obtained by integrating a current waveform resulting from the load voltage over the period of applying the P pulse at 916, integrating a current waveform over the period of applying the U pulse at 918, and subtracting the integrated waveform of the U pulse from the integrated waveform of the P pulse, such as described in equation (1) and in FIG. 6B.

A negative pulse N is applied at 920 that writes a "1" to the capacitor followed by another negative pulse D applied at 922. Subsequently, a PNP sequence follows at 924 that prepares the capacitor for subsequent cycles or runs.

A similar sequence of pulses is typically applied to another capacitor for data "0" in a complementary fashion, as stated supra. A suitable sequence to obtain the complementary, opposite state information is a PNP pulse sequence followed by a delay, a U pulse to read a "0" and obtain a long delay polarization value, another U pulse, an NDPU sequence to obtain the short delay polarization value. Subsequently, an NPN pulse sequence is performed to reset the capacitor back into the data "1" state. The short delay polarization value for the data "0" capacitor subtracted from the short delay polarization value for the data "1" capacitor provides a short delay polarization margin value and the long delay polarization value for the data "0" capacitor subtracted from the long delay polarization value for the data "1" capacitor provides a long delay polarization margin value.

The inventors of the present invention note that measured or obtained values of switching polarization, and therefore, initial retention margin, can vary significantly from short delay measurement techniques, such as described in FIG. 6B and FIG. 9A and long delay (some delay) measurement techniques, such as described in FIG. 9A, for the same device. As a result, a higher polarization value for a short delay measurement than polarization value for a long delay measurement does not necessarily indicate that a capacitor has a superior lifetime. In fact, a capacitor having a lower value for a short delay measurement can have a superior lifetime due to variations in the measurement techniques. However, the inventors of the present invention recognize that comparing short delay polarization values with long delay polarization values in itself can indicate characteristics of the ferroelectric memory devices including, but not limited to, quality, reliability, data retention lifetimes, and the like.

Figure 9B:
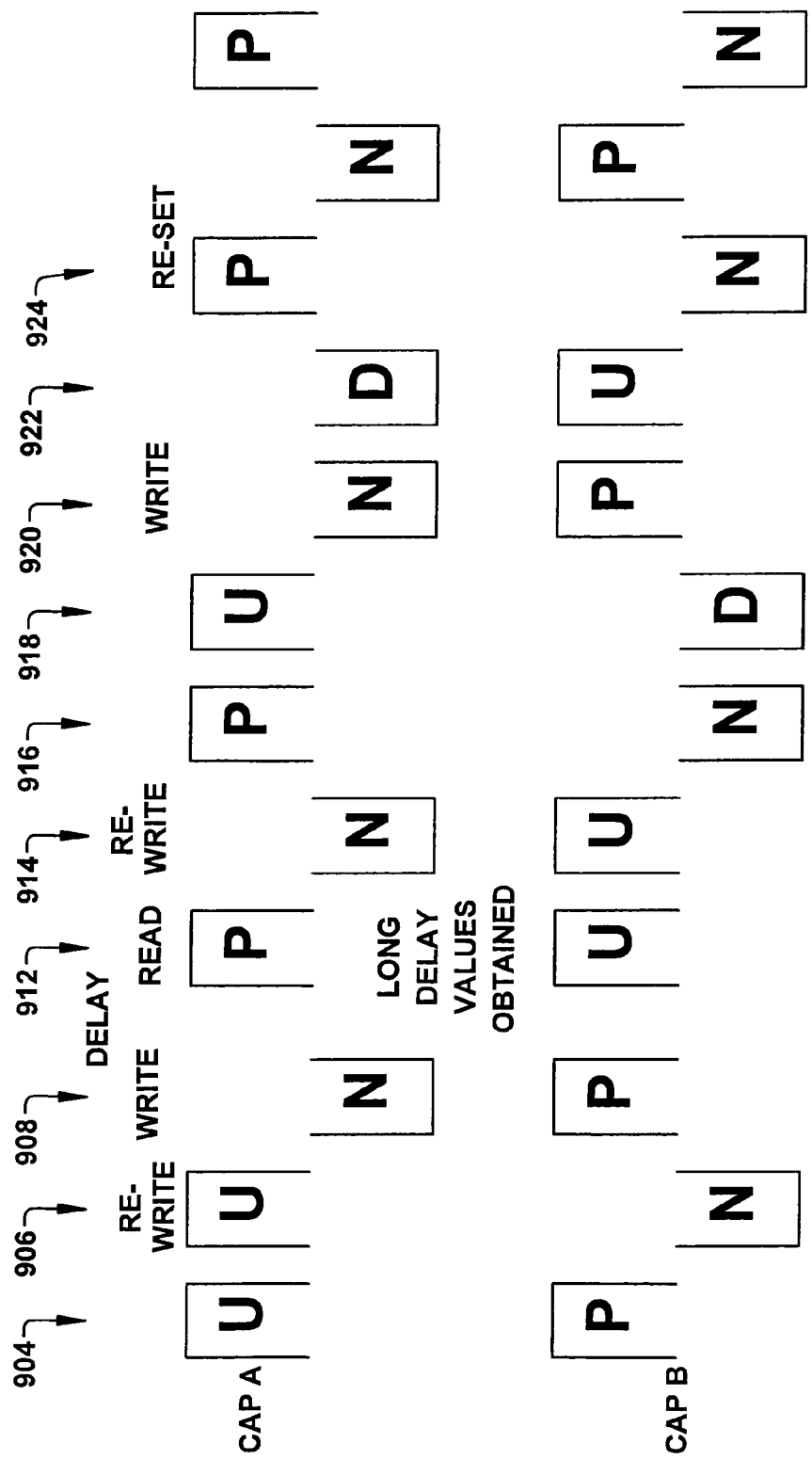
FIG. 9B is a diagram illustrating an exemplary sequence of pulses that obtains long and short delay polarization values in accordance with an aspect of the present invention.

FIG. 9B is a diagram 930 illustrating an exemplary sequence of pulses that obtains short and long delay polarization values in accordance with an aspect of the present invention. The diagram 930 depicts the exemplary sequence for a first ferroelectric capacitor, capacitor A, and a second ferroelectric capacitor, capacitor B, which is a complement of the capacitor A. The sequence illustrated in FIG. 9B is similar to that illustrated in FIG. 9A and, therefore, FIG. 9A should be referenced for additional description of the sequence.

A positive pulse U is applied to capacitor A at 904 to write a "0" or read a previously written value and a positive pulse P is applied to capacitor B in order to read the capacitor. At 906, data is re-written by applying a U pulse to the capacitor A, which writes a "0", and applying a N pulse to the capacitor B, which writes a 1. At 908, a negative pulse N is applied to the capacitor A that writes a "1" value and a positive pulse P is applied to the capacitor B, which writes a "0" value to the capacitor B.

A long delay occurs and the capacitor A is read at 912 by a positive pulse P. This read of the capacitor A obtains a long delay polarization value. Similarly, the capacitor B is read at 912 by a positive pulse U, which obtains a long delay polarization value for the capacitor B. At 914, data is re-written to the capacitors by applying a negative pulse N to the capacitor A and a positive pulse U to the capacitor B.

A PUND sequence is performed on the capacitor A at 916, 918, 920, and 922 in order to obtain a short delay polarization value for the capacitor A and a NDPU sequence is simultaneously performed on the capacitor B in order to obtain a short delay polarization value for the capacitor B. Subsequently, at 924, a PNP pulse sequence is applied to the capacitor A and an NPN sequence is applied to the capacitor B in order to reset the capacitors to known data states.

Figure 10:
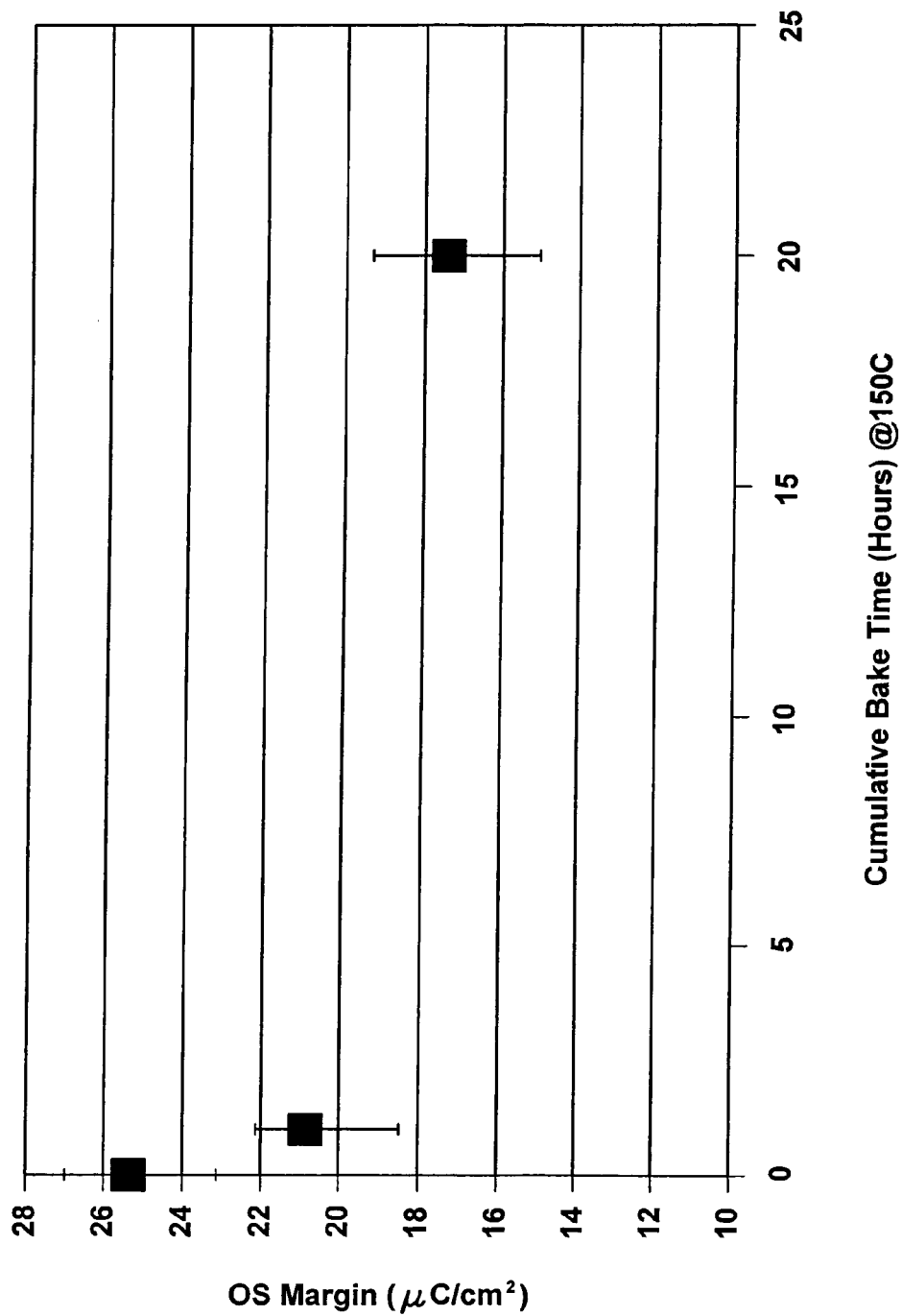
FIG. 10 is a graph illustrating exemplary signal margin obtained by thermal based data retention lifetime testing and comparing the obtained margins with measured short/long delay polarization values in accordance with an aspect of the present invention.

FIG. 10 is a graph 1000 illustrating exemplary signal margin obtained by thermal based data retention lifetime testing and comparing the obtained margins with measured short/long polarization values in accordance with an aspect of the present invention. The graph 1000 is provided to illustrate the degradation of opposite state signal margin over time. The graph 1000 illustrates an example of test capacitors measured across a wafer with auto prober implementation. The graph 1000 and analysis are presented for exemplary purposes in order to more fully illustrate the present invention. The graph 1000 and analysis should not be interpreted as limiting the present invention to particular values and/or resulting correlations.

The graph 1000 includes an x-axis representing cumulative bake time in hours at 150 degrees Celsius and a y-axis representing opposite state polarization margin in $uC/cm^2$. The test capacitors had a 17 percent reduction in average opposite state signal margin after 1 hour of cumulative bake and a 32 percent reduction in average opposite state signal margin after 20 hours of cumulative bake. Initial short delay and long delay polarization values were obtained for these capacitors and resulted in a difference of about 20 percent, on average. As a result, future comparisons of short delay and long delay polarization values for similar ferroelectric capacitors that yield about 20 percent, on average, can be expected to have similar results in data retention lifetime testing.

Figure 11:
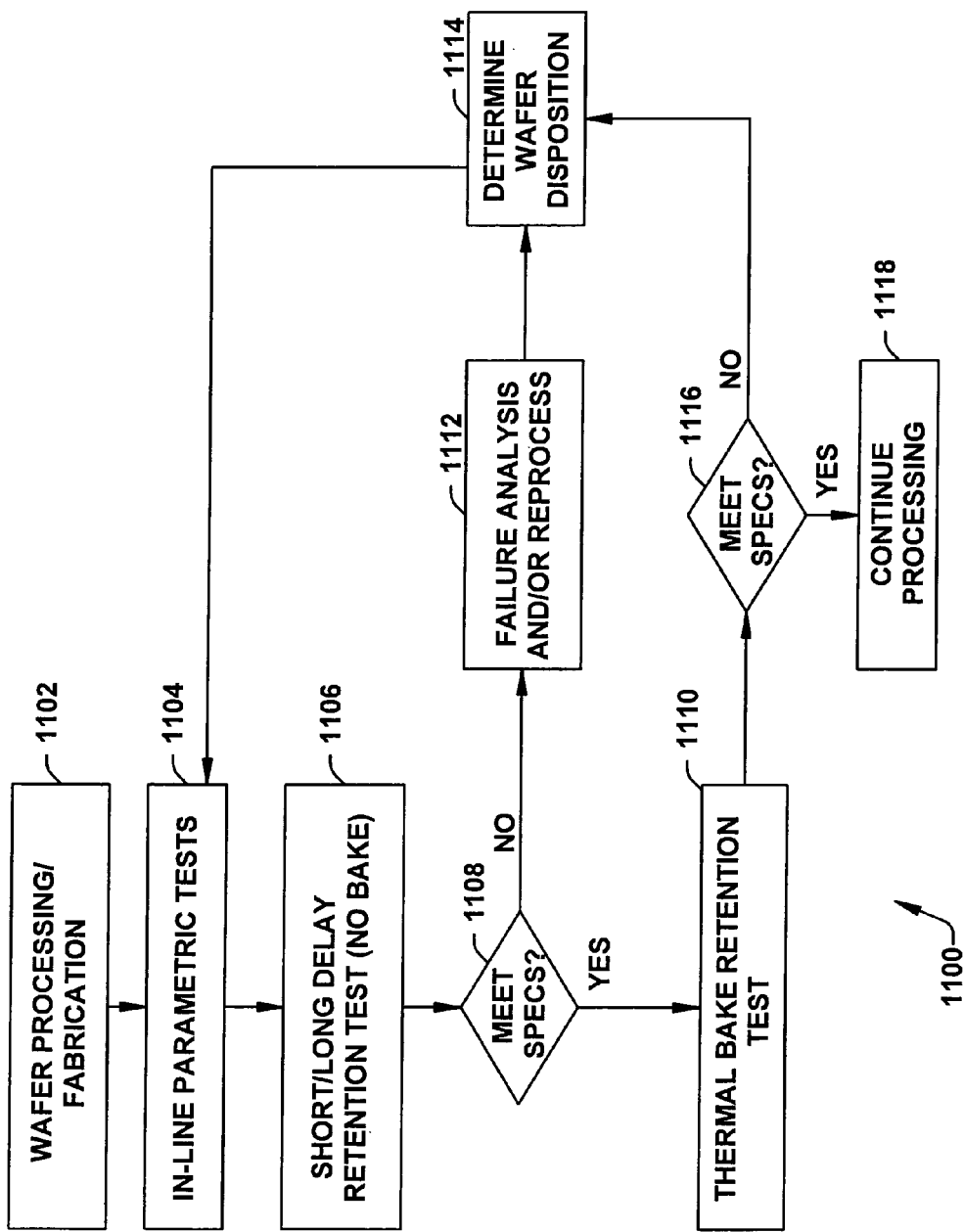
FIG. 11 is a flow diagram illustrating a method for evaluating and processing ferroelectric memory devices in accordance with an aspect of the present invention.

FIG. 11 is a flow diagram illustrating a method 1100 for evaluating and processing ferroelectric memory devices in accordance with an aspect of the present invention. The method 1100 includes a short/long delay retention test that obtains data retention lifetimes for ferroelectric memory devices in a relatively non-destructive and low cost manner. As a result, unnecessary performances of conventional thermal/bake based retention tests can be mitigated.

The method 1100 begins at block 1102 wherein a ferroelectric memory device is substantially fabricated. The fabricated ferroelectric memory device comprises ferroelectric memory cells that respectively comprise a ferroelectric capacitor formed with a ferroelectric material. The ferroelectric capacitors typically comprise the ferroelectric material formed between first and second electrodes that operate as plates of the ferroelectric capacitors. The ferroelectric material provides the ferroelectric type operation illustrated in FIG. 4 and can be of a suitable material, such as, but not limited to, $Pb(Zr,Ti)O_3$ (PZT), $(Ba,Sr)TiO_3$ (BST), $SrTiO_3$ (STO) and $SrBi_2Ta_2O_9$ (SBT), $BaTiO_3$ (BTO), and $(Bi_{1-x}La_x)_4Ti_3O_{12}$ (BLT). Generally, one of the electrodes is connected to a drive line or plate line and the other is selectably connected to a bitline or bitline bar, such as shown in FIGS. 1 and 2. One or more ferroelectric capacitors present on the ferroelectric memory device can be designated as or fabricated as test capacitors.

In-line parametric tests are performed on the ferroelectric memory device at block 1104 to obtain parametric values of the device. The in-line parametric tests comprise a number of individual tests designed to test the integrity of structures formed within the memory device. For example, the in-line parametric tests can include DC leakage measurements, switched polarization at a few write/read voltages; testing for other structures (transistors, via chain resistances, oxides, and the like), typical CMOS electrical tests, and the like.

Continuing at block 1106, a short/long delay retention test is performed to obtain a data retention lifetime for the ferroelectric memory device. The test employs one or more cycles in which short delay polarization values and long delay polarization values are obtained and typically operates one or more test capacitors. The short delay polarization values are obtained by writing a data value and then, after a short delay of less than about 100 micro-seconds, reading back the data value and measuring the resulting polarization. The long delay polarization values are obtained by writing the data value and, after a long delay, reading back the data value and measuring the resulting polarization. The short delay polarization values and long delay polarization values are correlated to obtain data retention lifetimes for the tested ferroelectric capacitors. The individual data retention lifetimes can then be combined into an overall data retention lifetime for the ferroelectric memory device by, for example, computing an average. Generally, large differences between the short delay polarization margin and the long delay polarization margin indicate a relatively weak data retention lifetime (e.g., less than expected) whereas smaller differences indicate a relatively strong data retention lifetime (e.g., a suitable data retention lifetime). For example, a capacitor having a short delay polarization value of 34.67 had a better data retention lifetime than another capacitor having a short delay polarization value of 45.04.

The short/long delay retention tests can be performed on ferroelectric test capacitors. However, the short/long delay retention tests are not limited to being performed on test capacitors and can be performed on ferroelectric capacitors of almost any ferroelectric memory cells of the device. Thus, the short/long delay retention tests can be performed on selected individual ferroelectric memory cells, arrays of memory cells, engineering test structures, every ferroelectric memory cell of the device, and the like. The engineering test structures are simulated memory cells that comprise a ferroelectric capacitor, but do not necessarily have all the features of regular ferroelectric memory cells.

The short/long delay retention test at block 1106 is described without a bake cycle. However, alternate aspects of the invention contemplate employing a short bake cycle within the short/long delay retention test in order to activate impurities within ferroelectric material of the device. A suitable short bake cycle is performed at a temperature range of about 85 degrees Celsius to about 200 degrees Celsius for a duration of about 1 hour. An inert gas, such as nitrogen or argon, can be employed to protect the device during the short bake cycle.

The obtained data retention lifetime and parametric values are compared with required values at block 1108 to determine whether the ferroelectric device is acceptable. If the data retention lifetime and parametric values are acceptable, a thermal/bake data retention lifetime test is performed at block 1110 to obtain a thermal based data retention lifetime for the ferroelectric memory device. This test can be destructive and is, therefore, typically performed on a small subset of ferroelectric memory devices within a production lot. The thermal/bake data retention test typically employs one or more pairs of ferroelectric capacitors. Programming and reading operations are performed on the one or more capacitors and they are subjected to baking at elevated temperatures (e.g., 150 degrees Celsius) in order to accelerate aging. Each pair of capacitors are programmed in a complementary fashion in order to obtain same state signal margins and opposite state signal margins. The data retention lifetime for the ferroelectric capacitors can then be determined by identifying points or cycles at which the signal margins drop below threshold values.

If the data retention lifetime and/or parametric values are not acceptable, analysis of failure and/or reprocessing of the ferroelectric device is performed at 1112. The analysis attempts to identify one or more components that are not performing within desired specifications and also to identify a source of these faulty components. Additionally, the analysis attempts to identify what may have changed or gone wrong with the processing. As a result, alterations to the fabrication process can be made that mitigate future failures in device performance. In some situations it may be possible to reprocess the ferroelectric memory device, wherein one or more mechanisms are employed to correct the identified faulty components. For example, a defective layer may be reformed or a contact plug may be refilled. Additionally, electric and/or thermal treatments can be performed to correct the identified faulty components or compensate for faulty operation.

Continuing, disposition of the ferroelectric memory device is determined at block 1114. The device may be returned to block 1104 to re-perform parametric testing and continue there from. Alternately, the device can be delegated for another operation in which its measured parametric values and/or data retention lifetime are deemed suitable. For example, parametric values may indicate that a particular device is unable to operate at a particular speed. In this example, the device can be designated for use at a lower speed. Additionally, the device can be deemed fatally flawed and disposed of, thereby mitigating use of further resources on the device. Also, the device can be transferred to another block of the method, if deemed appropriate.

The obtained thermal based data retention lifetime is compared with required values at block 1116 to determine whether the ferroelectric device is acceptable. If the data retention lifetime is acceptable, a further processing and/or packaging can then be performed at block 1118. Otherwise, the disposition of the wafer is determined at block 1114, as described above.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of evaluating ferroelectric memory devices:
   providing a ferroelectric memory cell comprising ferroelectric capacitors comprising ferroelectric material;
   writing a data value to the ferroelectric memory cell;
   performing a short delay;
   reading the data value from the ferroelectric memory cell and obtaining a short delay polarization value;
   re-writing the data value to the ferroelectric memory cell;
   performing a long delay;
   re-reading the data value from the ferroelectric memory cell and obtaining a long delay polarization value; and
   correlating the short delay polarization value with the long delay polarization value and obtaining a data retention lifetime for the ferroelectric memory cell according to the correlation.

2. The method of claim 1, wherein performing a short delay comprises waiting a period of time less than about 10 micro-seconds.

3. The method of claim 1, wherein performing a long delay comprises waiting a period of time more than about 100 milli-seconds.

4. The method of claim 1, wherein writing the data value comprises writing a "0" value.

5. The method of claim 1, wherein writing the data value comprises writing a "1" value.

6. The method of claim 1, wherein obtaining the data retention lifetime further comprises comparing the correlation with experimental data.

7. The method of claim 1, wherein the method is repeated a number of cycles.

8. The method of claim 1, wherein the short delay polarization value is obtained after the long delay polarization value is obtained.

9. The method of claim 1, further comprising performing a short bake cycle prior to performing the short delay and prior to performing the long delay.

10. The method of claim 9, wherein the short bake cycle comprises writing a data value, raising the ferroelectric memory cell to an elevated temperature, and remaining at the elevated temperature for a relatively short duration.

11. The method of claim 10, wherein the elevated temperature is about 85 degrees Celsius to about 200 degrees Celsius and the relatively short duration is about an hour.

12. A method of evaluating ferroelectric memory cells of a ferroelectric memory device comprising:
    designating one or more ferroelectric capacitors of the device to test;
    selecting a number of cycles to perform short/long delay retention tests;
    selecting short delay and long delay values;
    performing the short/long delay retention tests for the selected number of cycles comprising obtaining short delay polarization and long delay polarization values for each cycle; and
    correlating the obtained short delay polarization and long delay polarization values and obtaining an overall data retention lifetime for the ferroelectric memory device according to the obtained correlations.

13. The method of claim 12, wherein designating the one or more ferroelectric capacitors comprises selecting an array of memory cells.

14. The method of claim 12, wherein designating the one or more ferroelectric capacitors comprises selecting one or more engineering test structures.

15. The method of claim 12, wherein designating the one or more ferroelectric capacitors comprises selecting all the ferroelectric memory cells of the device.

16. The method of claim 12, wherein designating the one or more ferroelectric capacitors comprises selecting complementary pairs of capacitors.

17. The method of claim 12, wherein obtaining the overall data retention lifetime comprises obtaining individual data retention lifetimes for the test capacitors and computing an average data retention lifetime.

18. The method of claim 12, wherein correlating the obtained short delay polarization values and long delay polarization values comprises identifying differences between the short delay polarization values and the long delay polarization values.

19. The method of claim 18, wherein smaller identified differences obtain longer data retention lifetimes.

20. A method of evaluating ferroelectric memory devices comprising:

providing a ferroelectric memory device comprising ferroelectric memory cells and ferroelectric test capacitors;

performing in-line parametric tests on the ferroelectric memory device to obtain parametric values;

performing short/long delay retention tests on the ferroelectric test capacitors and obtaining a short/long delay data retention lifetime for the ferroelectric device;

comparing the parametric values and the obtained short/long delay data retention lifetime with acceptable parametric values and retention lifetimes;

performing thermal bake data retention lifetime testing for the ferroelectric memory device on the compared parametric and short/long delay data retention lifetime being acceptable; and determining disposition of the ferroelectric memory device for the ferroelectric memory device on the compared parametric and short/long delay data retention lifetime being unacceptable.

21. The method of claim 20, wherein performing the short/long delay retention tests comprises obtaining short delay and long delay polarization values and determining the short/long delay data retention lifetime according to the obtained short delay and long delay polarization values.

22. The method of claim 20, wherein obtaining short delay and long delay polarization values comprises applying sequences of pulses to the test capacitors and measuring load voltage.

23. The method of claim 20, wherein performing the thermal bake data retention lifetime testing simulates a 10 year product lifetime.

* * * * *